（12）United States Patent
Verspecht

(10) Patent No.: US 8,914,271 B2
(45) Date of Patent: Dec. 16, 2014

(54) METHOD FOR PREDISTORTING SIGNALS FOR NON-LINEAR COMPONENTS IN THE PRESENCE OF LONG TERM MEMORY EFFECTS

(75) Inventor: Jan Verspecht, Opwijk (BE)

(73) Assignee: Keysight Technologies, Inc., Santa Rosa, CA (US)

( * ) Notice: Subject to any disclaimer, the term of this patent is extended or adjusted under 35 U.S.C. 154(b) by 333 days.

(21) Appl. No.: 13/307,311

(22) Filed: Nov. 30, 2011

(65) Prior Publication Data

US 2013/0138416 A1    May 30, 2013

(51) Int. Cl.
*G06F 17/50* (2006.01)
*H04B 17/00* (2006.01)
*H03F 3/20* (2006.01)

(52) U.S. Cl.
CPC . *H04B 17/00* (2013.01); *H03F 3/20* (2013.01)
USPC .............................. 703/13; 375/297; 330/149

(58) Field of Classification Search
CPC ................. H04B 17/00; H04B 1/0458; H04B 2001/0408; H03F 1/26; H03F 3/20; H03F 3/11; H04K 1/02; G01R 23/16
USPC .................... 703/13, 18; 375/297; 324/76.22; 330/149; 455/127.2; 367/13
See application file for complete search history.

(56) References Cited

U.S. PATENT DOCUMENTS

| | | | |
|---|---|---|---|
| 7,295,961 B2 | 11/2007 | Root et al. | |
| 7,924,956 B2 | 4/2011 | Maltsev et al. | |
| 8,005,162 B2 | 8/2011 | Cai et al. | |
| 2005/0116775 A1* | 6/2005 | McBeath et al. | 330/149 |
| 2005/0157814 A1* | 7/2005 | Cova et al. | 375/297 |
| 2007/0194776 A1* | 8/2007 | Bossche | 324/76.22 |
| 2008/0130789 A1* | 6/2008 | Copeland et al. | 375/297 |
| 2009/0121788 A1* | 5/2009 | Deisch | 330/149 |
| 2010/0225389 A1* | 9/2010 | Teetzel | 330/149 |
| 2011/0068868 A1* | 3/2011 | Shi et al. | 330/149 |
| 2011/0163806 A1* | 7/2011 | Hongo | 330/149 |
| 2011/0242933 A1* | 10/2011 | Maissant et al. | 367/13 |
| 2012/0086507 A1* | 4/2012 | Kim et al. | 330/149 |
| 2012/0108189 A1* | 5/2012 | McCallister et al. | 455/127.2 |
| 2012/0119832 A1* | 5/2012 | Bai et al. | 330/149 |

OTHER PUBLICATIONS

Co-pending U.S. Appl. No. 12/787,736, filed May 26, 2010.
Moon, et al.,"Enhanced Hammerstein Behavioral Model for Broadband Wireless Transmitters," IEEE Transactions on Microwave Theory and Techniques, vol. 59, No. 4, pp. 924-933, Apr. 2011.
Younes, et al.,"An Accurate Complexity-Reduced 'PLUME' Model for Behavioral Modeling and Digital Predistortion of RF Power Amplifiers," IEEE Transactions on Industrial Electronics, vol. 58, No. 4, pp. 1397-1405, Apr. 2011.

(Continued)

*Primary Examiner* — Kandasamy Thangavelu

(57) ABSTRACT

A method and system for predistorting signals provides a test signal to model a non-linear component. Model kernels representative of static and dynamic parts of the model are extracted from an output of the non-linear component responsive to the test signal. The dynamic part represents memory effects of the non-linear component. The model kernels are then used to calculate an inverse memory model component model. An input signal is predistorted using the inverse memory model.

26 Claims, 8 Drawing Sheets

(56) References Cited

OTHER PUBLICATIONS

Mkadem, et al.,"Physically Inspired Neural Network Model for RF Power Amplifier Behavioral Modeling and Digital Predistortion," IEEE Transactions on Microwave Theory and Techniques, vol. 59, No. 4, pp. 913-923, Apr. 2011.

Verspecht, et al. "Extension of Xparameters to Include Long-Term Dynamic Memory Effects," Conference Record of the 2009 IEEE MTT-S International Microwave Symposium, Jun. 2009.

Verspecht, et al. "A Simplified Extension of X-parameters to Describe Memory Effects for Wideband Modulated Signals," Conference Record of the Spring 2010 ARFTG Conference, Anaheim, USA, Jun. 2010.

H. Ku et al., "Quantifying memory effects in RF power amplifiers", IEEE Transactions on Microwave Theory and Techniques, vol. 50, No. 12, Dec. 2002, pp. 2843-2849.

J. Verspecht et al., "Polyharmonic distortion modeling", IEEE Microwave Magazine, vol. 7, No. 3, Jun. 2006, pp. 44-57.

J. Verspecht et al., "Multi-tone, Multi-port, and Dynamic Memory Enhancements to PHD Nonlinear Behavioral Models from Large-signal Measurements and Simulations Measurements", 2007 IEEE/MTT-S International Microwave Symposium, 2007, pp. 969-972.

J. C. Pedro et al., "A comparative overview of microwave and wireless power-amplifier behavioral modeling approaches", IEEE Transactions on Microwave Theory and Techniques, vol. 53, No. 4, Apr. 2005, pp. 1150-1163.

F. Filicori et al., "A nonlinear integral model of electron devices for HB circuit analysis", IEEE Transactions on Microwave Theory and Techniques, vol. 40, No. 7, Jul. 1992, pp. 1456-1465.

M. Isaksson et al., "A comparative analysis of behavioral models for RF power amplifiers", IEEE Transactions on Microwave Theory and Techniques, vol. 54, No. 1, Jan. 2006, pp. 348-359.

A. Soury et al., "A new behavioral model taking into account nonlinear memory effects and transient behaviors in wideband SSPAs", 2002 IEEE MTT-S International Microwave Symposium Digest, vol. 2, 2002, pp. 853-856.

E. Ngoya et al., "Chapter 3: Envelope Domain Methods for Behavioral Modeling", Fundamentals of Nonlinear Behavioral Modeling for RF and Microwave Design, J. Wood et al., Artech House, 2005, pp. 37-86.

Aaron Walker, "Behavioral Modeling and Characterization of Nonlinear Operation in RF and Microwave Systems", North Carolina State University, 2005, pp. 1-342.

John Wood et al, "A Behavioral Modeling Approach to Nonlinear Model-Order Reduction for RF/Microwave ICs and Systems", IEEE, vol. 52 No. 9, Sep. 2004, pp. 2274-2284.

* cited by examiner

METHOD FOR PREDISTORTING SIGNALS FOR NON-LINEAR COMPONENTS IN THE PRESENCE OF LONG TERM MEMORY EFFECTS

BACKGROUND

Microwave power amplifiers are important components in wireless telecommunication systems. A known problem with these amplifiers is that they can significantly distort the input signal, which typically is a carrier with modulation. This distortion causes errors in the telecommunication channels. An approach to eliminate or minimize amplifier distortion involves predistorting an input signal. According to this approach, a non-linear predistorter operator P[.] is applied to an input signal represented by a complex envelope A(t). The result is a predistorted signal P[A(t)]. The predistorted signal P[A(t)] is applied to the amplifier. P[.] is a perfect predistortion operator if the amplifier output is equal to a perfectly amplified version of A(t) when the amplifier receives P[A(t)] as the input signal. The predistorter distorts the input signal A(t) in such a way that it completely counteracts the nonlinear distortion of the amplifier.

Eliminating amplifier distortion is in many practical cases challenging because of the presence of long term memory effects. Long term memory effects can be attributed to dynamically changing internal biasing, temperature or trapping states. The distortion characteristics of an amplifier thus depend on the history of the input signal. This implies that the predistortion operator P[.] will not be a simple static map, but will be a dynamic operator that takes into account the history of the input signal A(t).

For an input signal X(t), an amplifier output signal Y(t) may be mathematically expressed using a functional operator F[.] as follows:

$$Y(.)=F[X(.)] \quad (1).$$

Symbol or terminology such as Y(.), X(.) and P[.] as variously used throughout this description, particularly the use of (.) and [.], signifies a generic representation of one or more arguments such as time, distance, temperature, etc. In equation (1), the operator F is not merely a function that maps X(t) into Y(t), but is rather a functional operator that maps a whole sequence of X(t) into Y(t).

Conventional predistorter algorithms have been based on discrete sampled versions of an input signal X(t), that may be expressed as follows:

$$X_n=X(nT_s) \quad (2).$$

In equation (2), the subindex "n" denotes a sampled value at "n" times the sampling time $T_s$. Predistorter algorithms are typically based on a predistorted signal $X_{PDn}$ given as follows:

$$X_{PDn}=F(X_n,X_{n-1},X_{n-2},\ldots,\beta_1,\beta_2,\ldots) \quad (3).$$

In equation (3), F(.) is a multidimensional function parametrized by the set of coefficients $\beta_1, \beta_2, \ldots$ etc. The coefficients may take the form of polynomials, neural nets, and combinations and variations of different formats. The coefficients may be calculated based upon a test sequence, whereby a test input signal $X_T(t)$ is applied to an amplifier, and the corresponding output signal $Y_T(t)$ is measured to derive the coefficients.

However, the function F(.) with a set of calculated constant coefficients fits as a good predistorter only for input signals that have the same spectral and statistical characteristics as the test sequence. A predistorter based on the above noted predistorter algorithm would be effective only for input signals that at least have the same modulation bandwidth and amplitude distribution as the test sequence. The performance of such a conventional predistorter will degrade quickly when the input signals do not have the same modulation bandwidth and amplitude distribution as the test sequence, such as when the mean power of the input signal is changed or when the input signal has a different type of modulation with amplitude distribution significantly different from the test sequence. The conventional predistorter as described is sensitive to amplitude distribution and bandwidth of the input signal.

Although the complexity of the function F(.) may be increased, the number of coefficients would consequently also increase. These coefficients cannot be directly measured and must instead be determined by a fitting procedure, which is very difficult to perform. As an alternative, new sets of coefficients may be continuously calculated using actually measured input signal sequences and corresponding output signal sequences as test sequences. However, this complex nonlinear feedback loop approach would necessitate many digital as well as analog parts, is very challenging to implement in an efficient and robust way, and a significant amount of time would be required to achieve accuracy responsive to a sudden change in the characteristics of the input signal.

What is needed is a method of predistorting signals for non-linear components in the presence of memory effects for a wide range of input signal modulation bandwidths and for all possible input signal amplitude distribution that is insensitive to input signal power level or modulation format, that is suitable for all possible peak-to-average ratios of input signals, that does not include feedback requiring continuous recalculation of predistorter coefficients, and that can be implemented using a feedforward approach.

SUMMARY

In a representative embodiment, a non-transitory computer readable medium stores a program executable by a computer for predistorting signals, the computer readable medium including a generating code segment for generating a test signal; a system model code segment for generating a system model from an output signal in response to the test signal, the system model including a dynamic part that characterizes memory effects of the system; a memory model code segment for generating an inverse memory model from the system model; and a predistorting code segment for predistorting an input signal using the inverse memory model.

In another representative embodiment, a method includes generating a test signal; generating a system model from an output signal in response to the test signal, the system model including a dynamic part that characterizes memory effects of the system; generating an inverse memory model from the system model; and predistorting an input signal using the inverse memory model.

In a further representative embodiment, a predistorting system includes an input device for receiving an input signal; a processing device configured to generate a system model from an output signal in response to a test signal and to generate an inverse memory model from the system model. The system model includes a dynamic part that characterizes the memory effects of a system. The predistorting system also includes a predistorter configured to predistort the input using the inverse memory model.

BRIEF DESCRIPTION OF THE DRAWINGS

The example embodiments are best understood from the following detailed description when read with the accompanying drawing figures. Wherever applicable and practical, like reference numerals refer to like elements.

DETAILED DESCRIPTION

In the following detailed description, for purposes of explanation and not limitation, example embodiments disclosing specific details are set forth in order to provide a thorough understanding of an embodiment according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

As described, conventional predistortion techniques are sensitive to bandwidth and amplitude distribution of the modulation at the input signal. In the representative embodiments to be described hereinafter, an amplifier is characterized using the hidden variables model described in copending application Ser. No. 12/787,736 filed May 26, 2010, entitled "Method and System For Characterizing, Modeling and Simulating Non-Linear Long Term Memory Effects," which is incorporated herein by reference in its entirety. The hidden variables model predicts the distortion of the amplifier having long term memory effects. From the kernels of the hidden variables model that describe the memory effects of the amplifier, an inverse set of kernels are calculated and applied to an ideal input signal to produce a predistorted signal. The predistorted signal is applied to the amplifier, which provides as an output a substantially perfectly amplified and substantially non-distorted version of the input signal. The inverse operator substantially eliminates distortion caused by long term memory effects and is inherently insensitive to bandwidth and amplitude distribution of the modulation at the input signal. As long as the amplifier does not degrade, the inverse set of kernels need only be calculated once.

The description as follows provides derivation and implementation of the dynamic X-parameter kernels of an amplifier that predicts the distortion of the amplifier having long term memory effects, and the dynamic X-parameter kernels of the predistorter used to produce the predistorted signal.

Figure 1:
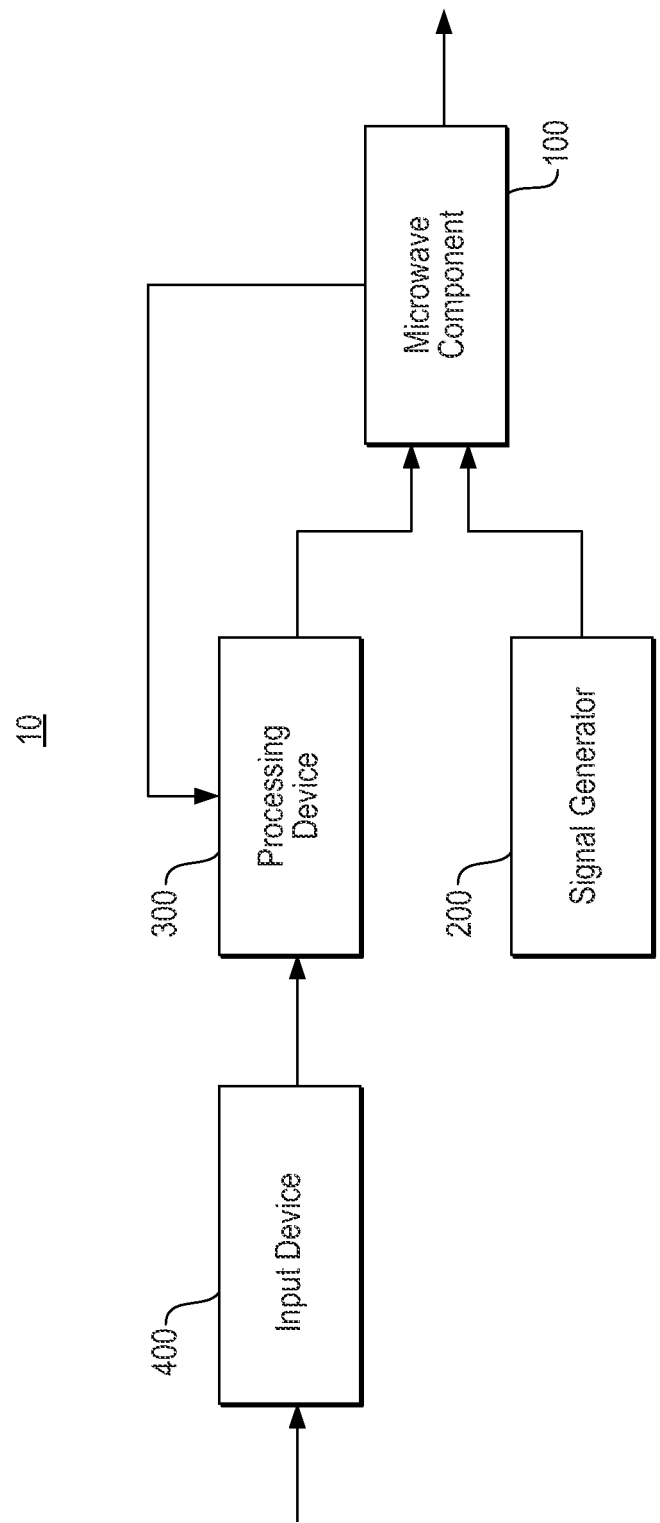
FIG. 1 is a simplified block diagram illustrating a system for predistorting input signals, according to a representative embodiment.

FIG. 1 is a simplified block diagram illustrating a system for predistorting input signals, according to a representative embodiment. In FIG. 1, system 10 includes input device 400 connected to processing device 300, and microwave component 100 connected to processing device 300 and signal generator 200. In this example, microwave component 100 is a power amplifier, and may be referred to as an amplifier in the following. However, microwave component 100 in the alternative may be other types of devices such as transistors, diodes, monolithic microwave integrated circuits (MMICS), multichip modules (MCMs), non-linear electronic analog components or circuits, and non-linear RF systems, without departing from the scope of the present teachings.

Input device 400 has an input signal to be amplified provided thereto. In an embodiment, input device 400 may include an RF front end and a down converter, and may provide an analog RF signal to processing device 300. Processing device 300 may include digital IQ demodulation (analog-to-digital conversion) as an initial stage that converts the RF signal to a digital signal for processing. In an another embodiment, input device 400 may additionally include an A/D converter to directly generate a digital signal and may provide the digital signal to processing device 300, so that digital IQ demodulation at processing device 300 is unnecessary. As will be subsequently described, processing device 300 generates and provides a predistorted signal to microwave component 100. In an embodiment where microwave component 100 is an amplifier, microwave component 100 produces and outputs a substantially perfectly amplified version of the input signal responsive to the predistorted signal.

Figure 2:
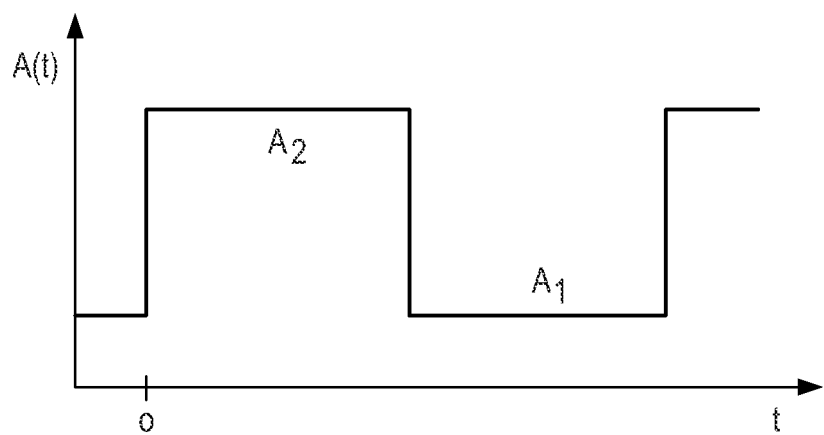
FIG. 2 is a graph illustrating a set of RF large step signals applied to microwave component 100, according to a representative embodiment.

Signal generator 200 is configured to generate and output a test signal A(t), which may be a set of multiple RF large signal steps, such as shown in FIG. 2. Signal generator 200 may include an independent external microwave source, or an internal microwave source of a network analyzer or non-linear network analyzer, or any source capable of providing the test signal as a stimulus.

Figure 3:
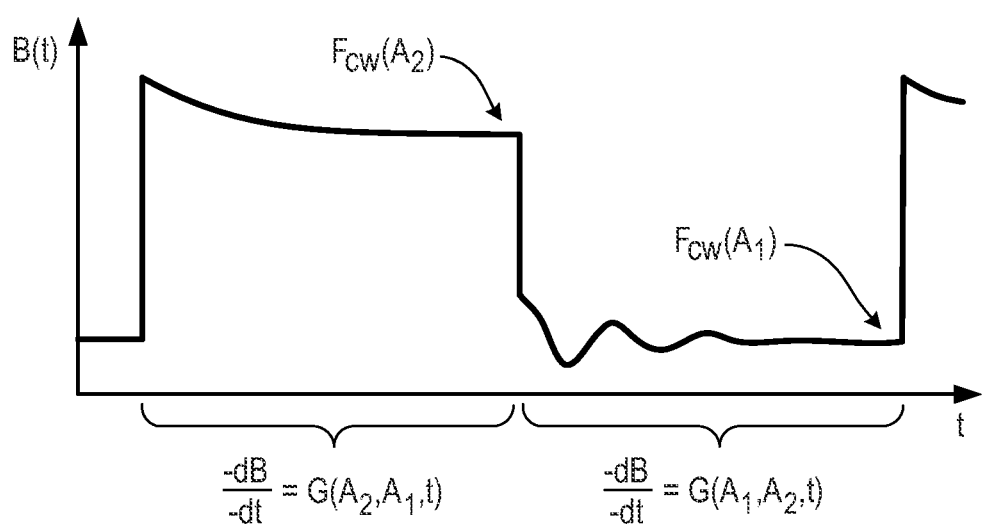
FIG. 3 is a graph illustrating a set of RF large signal step response signals output from the microwave component 100 responsive to the set of RF large step signals, according to a representative embodiment.

An initial step is to define the operating region power levels of microwave component 100. This sets the range of A(t), which may be a traveling wave that is applied to the input of microwave component 100. A(t) is generated as including a set of multiple RF large signal steps that are substantially quasi-perfect and clean with minimal noise. The set of large signal steps switch from a first initial power level A1 at an initial time t=0 to a second power level A2. Both power levels A1 and A2 of the set of RF large signal steps A(t) such as shown in FIG. 2 are stepped across the full operating range of microwave component 100, and cover a range of possible input signal amplitude values. The time duration of each step in the set of RF large signal steps A(t) is significantly longer than the duration of the long term memory effects of microwave component 100, so that the output envelope B(t) of microwave component 100, which is shown in FIG. 3, has reached steady state before the output amplitude level switches. The set of RF large signal steps A(t) may be represented as a set of points on a two dimensional grid, for example.

The set of multiple RF large signal steps shown in FIG. 2 is provided from signal generator 200 to microwave component 100 in FIG. 1. Microwave component 100 subsequently provides an output signal B(t) consisting of a simple set of RF large signal step responses to the set of RF large signal steps A(t). Using the output signal B(t), model kernels $F_{CW}(.)$ and $G(.)$ based on a behavioral model described by equation (4) are derived, which is discussed below.

With respect to the derivation of the behavioral model, microwave component 100, which in this example is an amplifier, will be considered as having an input signal A(t), the incident fundamental, and an output signal B(t), the amplified signal. For purposes of explanation, the signals are considered to be complex envelope representations of a modulated carrier. It will be assumed that the input signal can be represented as a modulated carrier with a fixed frequency. The model may be characterized as a so-called low-pass equivalent model that only processes the envelope information signal. The relationship between A(t) and B(t), where $\phi$ is the phase function of the complex envelope A(t), can be accurately described as equation (4) as follows:

$$B(t) = \left( F_{CW}(|A(t)|) + \int_0^\infty G(|A(t)|, |A(t-u)|, u)du \right) \exp(j\phi(A(t))). \quad (4)$$

A basic concept or characteristic of the behavioral model is that B(t) can be written as the superposition of a static part represented by the nonlinear function $F_{cw}(.)$, and a dynamic part represented by a simple integral over time of a nonlinear function G(.). As should be apparent to one of ordinary skill in the art, symbol or terminology such as $F_{cw}(.)$ or G(.) as variously used throughout, particularly the use of (.), signifies a generic representation of one or more arguments such as time, distance, temperature, etc. Each of the nonlinear function $F_{cw}(.)$ and the integrated function G(.) is a function of the instantaneous amplitude of the input signal A(t). The dependency on the phase $\Phi(t)$ of the input signal is represented as a separate multiplicative vector $\exp(j\phi(A(t)))$. To simplify the mathematical notation that follows, the following should be understood:

$$\Phi(t) = \exp(j\phi(A(t))).$$

As would be apparent to one of ordinary skill in the art, this phase dependency can be explained by the principle of time delay invariance. The static part behaves like a classic PHD (poly-harmonic distortion)-model. The dynamic part is original as it represents the memory effects. These are described as the integral effect of a general nonlinear function of the instantaneous amplitude of the input signal A(t), the past values of the input signal A(t−u) and how long ago that past value occurred (variable u). As shown in the following, the model equation (4) can be derived using the notion of hidden variables.

A starting point for the derivation of model equation (4) is a simple static PHD-model equation, which is equivalent to a simple compression and AM-to-PM (amplitude modulation-to-phase modulation) characteristic, as shown in equation (5):

$$B(t) = F(|A(t)|)\Phi(t) \quad (5)$$

In equation (5), the function F(.) represents mapping from the amplitude of the input signal to the corresponding output signal amplitude and phase, whereby the dependency on the phase of the input signal is represented as a separate multiplicative vector.

Memory effects may be introduced using one or more hidden variables. The idea is that, in a system with memory, the mapping from the input signal to the output signal is not a function of the input signal amplitude only, but is also a function of an arbitrary number N of a priori unknown hidden variables $h_1(t), h_2(t), \ldots, h_N(t)$. These variables represent time varying physical quantities inside the component, such as temperature, bias voltage or current, trapping states, or the like, that influence the mapping from the input signal to the output signal. With the introduction of the hidden variables, equation (5) becomes equation (6), as follows:

$$B(t) = F(|A(t)|, h_1(t), h_2(t), \ldots, h_N(t))\Phi(t) \quad (6).$$

To make equation (6) useful in the context of a black-box modeling approach, an assumption regarding the relationship between the hidden variables and the input signal is necessary. Although a priori information on the physics of the microwave component could be used to find this relationship, the black-box assumption on the relationship between the input signal and the hidden variables instead may be mathematically expressed as shown in equation (7):

$$\forall i: h_i(t) = \int_0^\infty P_i(|A(t-u)|)k_i(u)du. \quad (7).$$

As would be apparent to one of ordinary skill in the art, the symbol $\forall$ indicates the universal quantifier which may be informally read as "given any" or "for all".

Equation (7) expresses that the $i^{th}$ hidden variable is generated by a linear filter operation, characterized by its impulse response $k_i(.)$, that operates on a nonlinear function $P_i(.)$ of the input signal amplitude |A(.)|. The nonlinear function $P_i(.)$ may be interpreted as a source term that describes how the input signal is related to the excitation of a particular hidden variable, and in general this is a nonlinear relationship. For example, the nonlinear function $P_1(.)$ may be considered to be power dissipation as a function of the input signal, whereby $h_1(.)$ is temperature. The impulse response $k_i(.)$ describes the actual dynamics of a hidden variable, whereby $k_1(.)$ may describe thermal relaxation, for example. A special case of the above equations with only one hidden variable may be provided as follows $$h_1(t) = \int_0^\infty |A(t-u)|^2 e^{\frac{-u}{R}} \frac{du}{R},$$

or $$P_1(x) = x^2$$

and $$k_1(x) = \frac{1}{R} e^{\frac{-x}{R}},$$

wherein u is a dummy integration variable and R is a particular value that represents a time scale or parameter. In this above noted special case, equation (7) is physically related to the assumption that the amplitude squared relates to the bias current flowing through a first order linear bias circuit, which causes a variation of the bias voltage, which modulates the PHD-model. However, it should be understood that other physical effects may be described by equation (7), such as trapping effects and self-heating, whereby the dissipated power is a nonlinear function of A(t) and causes temperature changes, which are linearly related to the dissipated power, and which modulate the PHD-model. However, the nonlinear function $P_i(.)$ and the impulse response $k_i(.)$ that describe the actual dynamics of a hidden variable are not limited to the above examples, but should be understood to encompass a variety of other examples, as would be apparent to one of ordinary skill in the art. That is, the dynamic part of the system model changes responsive to varying operational conditions of the system including at least one of temperature, bias voltage and trapping states.

The link with equation (4) is subsequently made based on the assumption that equation (7) can be linearized in the hidden variables $h_i(t)$. In order to linearize, an operating point must be chosen. In the following, linearization around the steady state solution for the hidden variables that corresponds to the instantaneous amplitude $|A(t)|$ is chosen. In other words, linearization is chosen around the steady state solution that the system would reach assuming that the input amplitude is kept constant for all future time instants, the amplitude being equal to the instantaneous input amplitude. This linearization implicitly assumes that deviations of the hidden variables from their steady state solution are always small enough not to violate the linearity principle. These steady state solutions are a function of the input signal amplitude and are denoted in the following by $h_i^{CW}(.)$. For example, the value of $h_i^{CW}(X)$ is equal to the asymptotic value of the hidden variable $h_i(t)$ when a constant input signal amplitude equal to X is applied. Of note, the argument of $h_i^{CW}(.)$ is a signal amplitude, whereas the argument of the hidden variable $h_i(t)$ is time. The functions $h_i^{CW}(.)$ are easily calculated by simply substituting $A(t-u)$ by a constant X in equation (6):

$$\forall i: h_i^{CW}(X) = \int_0^\infty P_i(X)k_i(u)\,du = W_i P_i(X), \quad (8)$$

with $$W_i = \int_0^\infty k_i(u)\,du. \quad (9)$$

Equation (6) can then be rewritten as:

$$B(t) = F(|A(t)|, W_1 P_1(|A(t)|) + \Delta_1(t), W_2 P_2(|A(t)|) + \Delta_2(t), \ldots)\Phi(t) \quad (10),$$

with $\forall i: \Delta_i(t) = h_i(t) - W_i P_i(|A(t)|)$ \quad (11).

In equation (11), the new variable $\Delta_i(t)$ represents the deviation of the hidden variable $h_i(t)$ from its steady state solution corresponding to the instantaneous input signal amplitude. It is now further assumed that equation (6) can be linearized in these deviations from steady state $\Delta_i(t)$. This results in the following equations (12)-(14):

$$B(t) = \left(F_{CW}(|A(t)|) + \sum_{i=1}^N D_i(|A(t)|)\Delta_i(t)\right)\Phi(t), \quad (12)$$

with $$F_{CW}(|A(t)|) = F(|A(t)|, W_1 P_1(|A(t)|), W_2 P_2(|A(t)|), \ldots) \quad (13)$$

and $$D_i(x) = \left.\frac{\partial F}{\partial h_i}\right|_{(x, W_1 P_1(x), W_2 P_2(x), \ldots)}. \quad (14)$$

The functions $D_i(.)$ represent the sensitivity of the output signal to variations of the $i^{th}$ hidden variable. For example, if $h_1(.)$ represents the temperature, $D_1(.)$ represents how sensitive the output signal is to temperature changes. Of note, $D_i(.)$ is a general nonlinear function of the instantaneous input signal amplitude. It is perfectly possible, for example, that the output signal is highly sensitive to temperature changes for small input signals (corresponding to a temperature dependent small signal gain), but not at all for high input signals whereby the output is fully saturated.

In the structure of equation (12), a static part represented by $F_{CW}(.)$ and a dynamic part represented by the summation over the hidden variables index "i" can be distinguished. The static part, which can be derived from $F(.)$ using equation (13), corresponds to a classic static PHD-model. Of note, the subscript "CW" is used in $F_{CW}(.)$ because this function corresponds to the response of the amplifier to a single tone continuous wave (CW) excitation. Substitution of $h_i(t)$ in equation (11) using equation (7), and subsequently substitution of $\Delta_i(t)$ in equation (12) using equation (11) results in the following:

$$B(t) = F_{CW}(|A(t)|) \cdot \Phi(t) + \quad (15)$$
$$\sum_{i=1}^N D_i(|A(t)|)\left(\int_0^\infty P_i(|A(t-u)|)k_i(u)\,du - W_i P_i(|A(t)|)\right)\Phi(t).$$

Using equation (9) and changing the order of summation and integration, equation (15) can be rewritten as follows:

$$B(t) = F_{CW}(|A(t)|) \cdot \Phi(t) + \quad (16)$$
$$\int_0^\infty \left\{\sum_{i=1}^N D_i(|A(t)|)(P_i(|A(t-u)|) - P_i(|A(t)|))k_i(u)\right\}du \cdot \Phi(t).$$

In general, it may not be known what the hidden variables are, nor how many there are or how they interact with the system. Nevertheless, the multivariate function $G(x,y,u)$ may always be defined as follows:

$$G(x, y, u) = \sum_{i=1}^N D_i(x)(P_i(y) - P_i(x))k_i(u), \quad (17)$$

such that $$B(t) = \left(F_{CW}(|A(t)|) + \int_0^\infty G(|A(t)|, |A(t-u)|, u)\,du\right)\Phi(t), \quad (18)$$

which is identical to equation (4). As such, equation (4) has been defined from a hidden variables approach.

Equation (17) reveals that the multivariate function $G(x,y,u)$ is not arbitrary, since the following relationship will always be valid:

$$\forall x, u: G(x,x,u) = 0 \quad (19).$$

This property is key in the experimental determination of the function $G(.)$.

The behavioral model can be completely identified from measuring a simple set of RF large signal step responses output from the amplifier responsive to a set of RF large signal steps applied to the amplifier. As previously stated, the input set of RF large signal steps may be such that the signal switches from a first value to a second value at time zero, so that the whole range of possible input RF signals to the microwave component are covered. The process is explained as below.

Consider the application of a step input signal, whereby $A(t) = A_1$ for $t < 0$ and whereby $A(t) = A_2$ for $t >= 0$. The solution for such a large signal step response $B(t)$ will be noted as $B_{LS}(A_1, A_2, t)$, and is then given by the following:

$$\forall t < 0 : B_{LS}(A_1, A_2, t) = F_{CW}(|A_1|) \exp(j\varphi(A_1)), \quad (20)$$

and $$\forall t \geq 0 : B_{LS}(A_1, A_2, t) = \quad (21)$$

$$F_{CW}(|A_2|) \exp(j\varphi(A_2)) + \int_0^t G(|A_2|, |A_2|, u) du \cdot \exp(j\varphi(A_2)) +$$

$$\int_t^\infty G(|A_2|, |A_1|, u) du \cdot \exp(j\varphi(A_2)).$$

Because of equation (19), equation (21) can be rewritten as follows:

$$\forall t \geq 0 : B_{LS}(A_1, A_2, t) = \quad (22)$$

$$F_{CW}(|A_2|) \exp(j\varphi(A_2)) + \int_t^\infty G(|A_2|, |A_1|, u) du \cdot \exp(j\varphi(A_2)).$$

Taking the derivative versus "t" at both sides of the above equation results in the following:

$$\forall t \geq 0 : \frac{dB_{LS}(A_1, A_2, t)}{dt} = -G(|A_2|, |A_1|, t) \cdot \exp(j\varphi(A_2)), \quad (23)$$

or $$\forall t \geq 0 : G(|A_2|, |A_1|, t) = -\frac{dB_{LS}(A_1, A_2, t)}{dt} \cdot \exp(j\varphi(A_2)). \quad (24)$$

As a consequence of the inherent causality of equation (4), the function G(x,y,t) only needs to be defined for positive values of "t". Equation (24) has a number of consequences. First, it allows for a straightforward measurement of the function G(x,y,t), which is determined by taking the inverse of the derivative of the step response when starting with input amplitude "y" and switching to input amplitude "x" at time 0. Second, there is a one-to-one mapping between the model and the step responses. Given that all possible large signal step responses can be measured, a simple nonlinear dynamic model that is able to generate the measured large signal step responses is the model as described by equation (4).

The behavioral model described above is called a dynamic X-parameter model. As shown, the model kernel functions $F_{cw}(.)$ and G(.) can be identified from a set of large signal step response measurements. This can be done as follows, with $B_{LS}(A_1,A_2,t)$ equal to the output signal corresponding to an input step switching from a level $A_1$ to a level $A_2$ at time 0:

$$F_{CW}(A_1) = B_{LS}(A_1, A_1, 0), \quad (25)$$

and $$G(A_1, A_2, t) = -\frac{\partial B_{LS}(A_2, A_1, t)}{\partial t}. \quad (26)$$

It therefore follows that in the context of dynamic x-parameters, the concept of predistorting signals for an amplifier in the representative embodiments can be thought of as follows. Given an amplifier with behavioral model kernels $F_{cw}(.)$ and G(.) as described by equations (25) and (26), a predistortion operator P[.] can be constructed such that for any signal A(t), the amplifier provides as an output a substantially perfectly amplified version of signal A(t) responsive to a predistorted input signal P[A(t)]. This may be mathematically expressed as follows:

$$\left( F_{CW}(|P[A(t)]|) + \int_0^\infty G(|P[A(t)]|, |P[A(t-u)]|, u) du \right) \cdot \quad (27)$$

$$\exp(j\varphi(P[A(t)])) = \alpha \cdot A(t).$$

In equation (27), the variable α represents gain. In other words, a cascade of the operator P[.] and the dynamic X-parameter model will behave as a perfect distortion free amplifier with gain α.

Construction of the dynamic predistorter of the representative embodiments is now described as follows. It is firstly noted that there is no direct way to find an exact solution for P[.] based on equation (27). As it is understood that P[.] corresponds to the inverse operator of a dynamic nonlinear operator, P[.] will also be a dynamic nonlinear operator. A practical solution is found by assuming that the inverse operator P[.] can itself be approximated by a dynamic X-parameter model. The inverse operator P[.] can thus be described by the following:

$$P[A(t)] \approx \left( F_P(|A(t)|) + \int_0^\infty G_P(|A(t)|, |A(t-u)|, u) du \right) \cdot \exp(j\varphi(A(t))). \quad (28)$$

In equation (28), $F_P(.)$ and $G_P(.)$ are the dynamic X-parameter kernels that correspond to the approximation of the inverse operator P[.]. Construction of the predistorter can then be formulated as finding $F_P(.)$ and $G_P(.)$ based on the knowledge of $F_{cw}(.)$, G(.) and α. The resulting predistorter may be characterized as a dynamic predistorter.

The fact that there is a one to one correspondence between the large signal step responses and the dynamic X-parameter kernel can be used to calculate $F_P(.)$ and $G_P(.)$. This is done as follows. First the so-called inverse large signal step responses, noted as $A_{INV}(B_1,B_2,t)$, are calculated, whereby $A_{INV}(B_1,B_2,t)$ is defined as that particular input signal that will result in a perfect step at the output of the amplifier switching between amplitude levels $B_1$ and $B_2$, and having zero phase. The details of the calculation of the inverse large signal step response $A_{INV}(B_1,B_2,t)$ will be described later. These inverse large signal step responses $A_{INV}(B_1,B_2,t)$ correspond, up to the gain factor α, to the large signal step responses of the dynamic predistorter. In other words, the model kernels of the dynamic predistorter may described as follows:

$$F_P(a) = A_{INV}(\alpha a, \alpha a, 0), \text{ and} \quad (29)$$

$$G_P(a_1, a_2, t) = -\frac{\partial A_{INV}(\alpha a_2, \alpha a_1, t)}{\partial t}. \quad (30)$$

Figure 4:
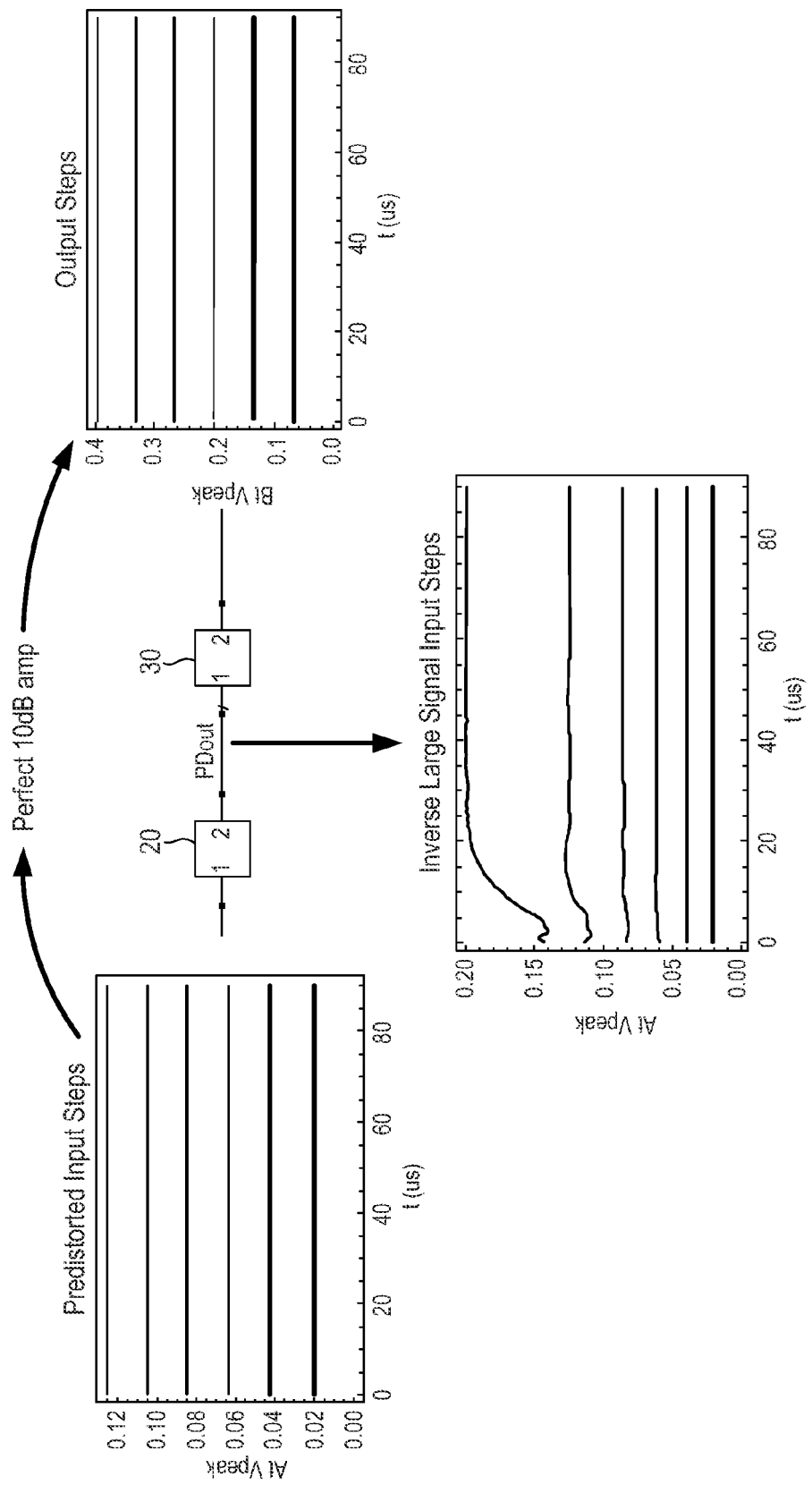
FIG. 4 is a block diagram illustrating the basic principles of a dynamic predistorter including corresponding signals, according to a representative embodiment.

The above choices for $F_P(.)$ and $G_P(.)$ can be demonstrated as correct by simply calculating the large signal step responses of a cascade of the dynamic X-parameter model 20 with kernels $F_P(.)$ and $G_P(.)$, and the original dynamic X-parameter model 30 with kernels $F_{CW}(.)$ and G(.), as shown in FIG. 4. That is, a perfect step switching from a level $A_1$ to a level $A_2$ at time zero may be applied at the input of the dynamic X-parameter model 20 having model kernels $F_P(.)$ and $G_P(.)$. By construction, the signal at the output of the dynamic X-parameter model 20 will be equal to $A_{INV}(\alpha A_1, \alpha A_2, t)$. This predistorter output signal may then be used as the input signal to the original dynamic X-parameter model 30. By the definition of $A_{INV}(.)$, the output signal of original dynamic X-parameter model 30 will be equal to a perfect step that switches from a level $\alpha A_1$ to $\alpha A_2$ at time zero. In other words, when excited by large signal steps, the cascade of the predistorter model with kernels $F_P(.)$ and $G_P(.)$ and the dynamic X-parameter model 30 with kernels $F_{CW}(.)$ and $G(.)$ behaves like a perfect memoryless amplifier system with gain $\alpha$. It is then simply assumed that the predistorter system with model kernels $F_P(.)$ and $G_P(.)$ will also behave as a good predistorter for arbitrary modulated signals.

Calculation of the above noted inverse large signal step responses will now be described as follows. As explained, the dynamic X-parameter kernels $F_P(.)$ and $G_P(.)$ of the dynamic predistorter of the representative embodiments for an amplifier system with dynamic X-parameter kernels $F_{CW}(.)$ and $G(.)$ may be easily derived from $A_{INV}(B_1, B_2, t)$ through the application of equations (29) and (30). Calculation of the inverse large-signal step response $A_{INV}(B_1, B_2, t)$ can be realized from the knowledge of $F_{CW}(.)$ and $G(.)$. This can be achieved based on equation (4) by expressing that the output signal B (t) is equal to a perfect step switching from an amplitude level $B_1$ to an amplitude level $B_2$ at time zero (having zero phase). For t<0 the solution is trivial, as it may be assumed that the system is in a continuous wave (CW) regime, and as such $$\forall t<0: A_{INV}(B_1,B_2,t)=F_{CW}^{-1}(B_1) \quad (31).$$

It is thereby assumed that the function $F_{CW}(.)$ is invertible. In the limit of t towards $\infty$, it may also be assumed that the system is in a CW regime and as such $$\lim_{t \to \infty} A_{INV}(B_1, B_2, t) = F_{CW}^{-1}(B_2). \quad (32)$$

For t>0, there is no other choice but to solve the integral equation (4) with B(t) equal to a perfect step switching from a level $B_1$ to $B_2$ at time zero. Given a certain value for $B_1$ and $B_2$, the value of $A_{INV}(B_1,B_2,t)$ will be equal to the time dependent function X(t) that is the solution of the following:

$$\left(F_{CW}(|X(t)|) + \int_0^\infty G(|X(t)|, |X(t-u)|, u)\,du\right)e^{j\varphi(X(t))} = B_2. \quad (33)$$

In order to solve equation (33), the amplitude of X(t) may be first calculated by solving the following:

$$\left|F_{CW}(|X(t)|) + \int_0^\infty G(|X(t)|, |X(t-u)|, u)\,du\right| = B_2. \quad (34)$$

The phase of X(t) is then simply given by $$\varphi(X(t)) = -\varphi\left(F_{CW}(|X(t)|) + \int_0^\infty G(|X(t)|, |X(t-u)|, u)\,du\right). \quad (35)$$

A practical way to solve equation (34) is to represent the unknown function X(t) by a discrete time series and to approximate the integral operator by a discrete summation. This may be started by choosing a sampling time $T_s$. In order for the algorithm to be accurate, $T_s$ needs to be significantly smaller than the time constant associated with the fastest long term memory effects. Using $X_i$ to denote $X(iT_s)$, equation (34) may be approximated by $$\left|F_{CW}(|X_i|) + \sum_{j=0}^\infty G(|X_i|, |X_{i-j}|, jT_s)T_s\right| = B_2. \quad (36)$$

Since $$\forall X: G(X,X,t)=0 \quad (37),$$

equation (34) may be written as:

$$\left|F_{CW}(|X_i|) + \sum_{j=1}^\infty G(|X_i|, |X_{i-j}|, jT_s)T_s\right| = B_2. \quad (38)$$

In view of equation (31) it is understood that $$\forall i<0: X_i = F_{CW}^{-1}(B_1) \quad (39).$$

$|X_0|$ may thus be found by solving the nonlinear equation:

$$\left|F_{CW}(|X_0|) + \sum_{j=1}^\infty G(|X_0|, |F_{CW}^{-1}(B_1)|, jT_s)T_s\right| = B_2. \quad (40)$$

The phase of $X_0$ may be given as:

$$\varphi(X_0) = -\varphi\left(F_{CW}(|X_0|) + \sum_{j=1}^\infty G(|X_0|, |F_{CW}^{-1}(B_1)|, jT_s)T_s\right). \quad (41)$$

The values for $|X_1|$, $|X_2|$, $|X_3|$, ... can then be found by successively solving the following:

$$\left|F_{CW}(|X_i|) + \sum_{j=1}^i G(|X_i|, |X_{i-j}|, jT_s)T_s + \sum_{j=i+1}^\infty G(|X_i|, |F_{CW}^{-1}(B_1)|, jT_s)T_s\right| = B_2 \quad (42)$$

for "i" equal to 1, 2, ... etc. The phases may thus be given as:

$$\varphi(X_i) = -\varphi\left(F_{CW}(|X_i|) + \sum_{j=1}^i G(|X_i|, |X_{i-j}|, jT_s)T_s + \sum_{j=i+1}^\infty G(|X_i|, |F_{CW}^{-1}(B_1)|, jT_s)T_s\right). \quad (43)$$

Of note, the calculation of $X_i$ only requires the knowledge of $X_k$'s with an index "k" smaller than "i". This implies that at any moment, the algorithm needs to solve a nonlinear equation in one unknown only. There is no coupling between the unknowns. In practice, the biggest challenge is not the finding of a solution, but the mere fact that the algorithm must be repeated for many values of "i", as well as multiple values of $B_1$ and $B_2$. The decoupling of the variables however does imply that the problem lends itself very well to parallel processing.

For an amplifier with a particular operating range, the manner in which a dynamic predistorter algorithm may be constructed for a specific carrier frequency is summarized as follows.

Step 1: Measure the response of the amplifier to a complete set of large signal steps. One such a measurement is called a large signal step response measurement. This is done by applying a signal, at the carrier frequency, which switches at time zero from one amplitude level $A_1$ to a different input level $A_2$. The corresponding complex baseband representation of the output signal is noted as $B_{LS}(A_1,A_2,t)$. This experiment is repeated for many different combined values of $A_1$ and $A_2$, such that the whole operating range of the amplifier is covered.

Step 2: Once $B_{LS}(A_1,A_2,t)$ is known, equations (25) and (26) are used to calculate the 2 dynamic X-parameter kernels of the amplifier, the static part $F_{CW}(.)$ and the dynamic part $G(.)$. This results in a dynamic X-parameter model for the amplifier.

Step 3: Once $F_{CW}(.)$ and $G(.)$ are known, they are used to calculate the inverse large signal step response function $A_{INV}(B_1,B_2,t)$ as described previously.

Step 4: Once $A_{INV}(B_1,B_2,t)$ is known, equations (29) and (30) are used to calculate the dynamic X-parameter kernels of the predistorter, namely the static part $F_P(.)$ and the dynamic part $G_P(.)$. The final gain, which can in principle be chosen arbitrarily, is $\alpha$.

Step 5: For any input signal $A(t)$, the corresponding dynamically predistorted signal $A_P(t)$ can be calculated as follows:

$$A_P(t) = \left(F_P(|A(t)|) + \int_0^\infty G_P(|A(t)|, |A(t-u)|, u)du\right) \cdot \exp(j\varphi(A(t))). \quad (44)$$

When the amplifier is excited using the input signal $A_P(t)$, the output signal $B(t)$ will be very close to the ideal amplified signal, namely $\alpha A(t)$.

Referring again to FIG. 1, microwave component 100 subsequently provides an output signal $B(t)$ consisting of a simple set of RF large signal step responses to the set of RF large signal steps $A(t)$. The corresponding complex baseband representation of the output signal is noted as $B_{LS}(A_1,A_2,t)$. Processing device 300 measures the corresponding output envelope signal $B(t)$ consisting of the set of RF large signal step responses generated by microwave component 100 responsive to the set of RF large signal steps $A(t)$. Applying equations (25) and (26) on the measured large signal step responses $B_{LS}(A_1,A_2,t)$, processing device 300 calculates the dynamic X-parameter kernels of microwave component 100, that is the static part $F_{CW}(.)$ and the dynamic part $G(.)$. The static part $F_{CW}(.)$ and the dynamic part $G(.)$ may be characterized as the system model of microwave component 100. Processing device 300 may include any component or hardware configured or programmed to provide such calculation. As shown in FIG. 3, for example, the steady state values of $B(t)$ after the transient is over correspond to the values of the static part represented by $F_{CW}(A_2)$ and $F_{CW}(A_1)$. The negative time derivatives $-dB/dt$ of $B(t)$ correspond to the dynamic part represented as the values of $G(A_2,A_1,t)$ and $G(A_1,A_2,t)$. Repeating this measurement for an entire range of $A_1$ and $A_2$ for the multiple RF large signal step responses provides complete knowledge of the model kernels $F_{CW}(.)$ and $G(.)$ described by equation (4). The values of $F_{CW}(A_2)$ and $F_{CW}(A_1)$ as calculated by processing device 300, and the negative time derivatives of $G(A_2,A_1,t)$ and $G(A_1,A_2,t)$ as determined by processing device 300 may be collected in tabular form. Thus, direct mapping between the measurements and the parameters of the model is realized in accordance with representative embodiments. This mapping can be characterized as a three dimensional model for the dynamic part, whereby each value of $G(.)$ is relative to two input amplitudes and a time instant.

From the calculated model kernels $F_{CW}(.)$ and $G(.)$, processing device 300 shown in FIG. 1 then calculates the inverse large signal step response function $A_{INV}(B_1,B_2,t)$ as described previously. Processing device 300 then uses equations (29) and (30) to calculate the dynamic X-parameter kernels of the predistortion, that is the static part $F_P(.)$ and the dynamic part $G_P(.)$. The static part $F_P(.)$ and the dynamic part $G_P(.)$ may be characterized as the inverse memory model corresponding to the system model of microwave component 100. Processing device 300 subsequently calculates the corresponding dynamically predistorted signal $A_P(t)$ for an input signal $A(t)$ provided from input device 400 using equation (44). The predistorted signal $A_P(t)$ is then provided or connected to microwave component 100, which subsequently outputs an amplified signal $\Delta A(t)$ that is a substantially non-distorted version of input signal $A(t)$. In the representative embodiments, input signal $A(t)$ may be of various complex arbitrarily modulated signal types, such as code division multiple access (CDMA), WCDMA, CDMA 2000, long term evolution (LTE), and time spread modulation (TSM), and may be steps, pulses, two-tone excitations, continuous waves and noise-like modulations, for example.

Although shown separately in FIG. 1, signal generator 200 and processing device 300 may be implemented together as components of an Agilent Technologies Nonlinear Vector Network Analyzer (NVNA) with X-Parameter technology (Agilent PNA-X) and pulsed envelope options, for example, or any analyzer, component or hardware configured or programmed to provide a test signal as described and to perform the corresponding calculations. The Agilent PNA-X is available commercially from Agilent Technologies, Inc., Santa Clara, Calif. In the case of the Agilent PNA-X, the two synthesizers therein in combination with the internal pulse modulator generate the set of RF large signal steps $A(t)$, which are input to microwave component 100.

A further representative embodiment is now described, in which a simplified predistorter may be designed for the case of wideband modulation. In the case of wideband modulated signals, if the statistics of the modulation amplitude are stationary, the dynamic X-parameter model can be simplified. In practice this assumption can often be made, especially with modern communication formats such as long term evolution (LTE) for example. Such a simplified model may be characterized as a wideband X-parameter model. The same idea that is used to simplify the dynamic X-parameters can also be used to design a simplified predistorter, which may be characterized as a wideband predistorter.

For an amplifier characterized by a wideband X-parameter kernel $K(.)$, it would be implied that the output envelope signal $Y(t)$ of the amplifier be related to the input signal $X(t)$ as follows:

$$Y(t) = \int_0^\infty K(X(t),u)p(u)du. \quad (45)$$

In equation (45), $p(.)$ represents the probability density function of the input signal amplitude. The value of the two dimensional kernel $K(.)$ is relatively easy to determine by performing a set of pulsed experiments. A large signal step that switches from an amplitude $A_1$ to an amplitude $A_2$ at time zero may be applied to the amplifier. The value of the output signal right after the switching (at a time equal to an infinitesimal positive ϵ) would be equal to $K(A_2,A_1)$. In particular, if the input signal X(t) is equal to the above noted large signal step, Y(t) will be given as follows:

$$Y(\varepsilon) = \int_0^\infty K(A_2, u)\delta(u - A_1)du = K(A_2, A_1). \quad (46)$$

In equation (46), δ(.) is equal to a Dirac-delta distribution. Of note, the kernel K(.) as used in equation (45) has a complex number as a first argument. The kernel function as derived by the step experiment, however, is only determined for a positive real first argument. The measured kernel K(.) is simply extended towards a complex first argument by using the characteristic of K(.) as follows:

$$K(X(t),y) = K(|X(t)|,y)e^{j\phi(X(t))} \quad (47).$$

The wideband predistorter is constructed based on this idea.

The predistorter itself may be written as a wideband X-parameter model as follows:

$$X_{PD}(t) = \int_0^\infty K_{PD}(X(t), u)p(u)du. \quad (48)$$

Consequently, knowing the two dimensional kernel K(.), the two dimensional wideband predistortion kernel $K_{PD}(.)$ must next be determined such that the cascade of the two behaves like a near perfect amplifier with gain α. In other words, upon applying a large signal input step switching from amplitude $A_1$ to amplitude $A_2$, the output signal of the cascaded system must switch between an amplitude level $\alpha A_1$ to an amplitude level $\alpha A_2$, at least right after the step has been applied (at an infinitesimal time ϵ). The resulting amplitude right after the step of the cascaded system can mathematically be calculated as follows:

$$Y(\varepsilon) = K(K_{PD}(A_2,A_1),K_{PD}(A_1,A_1)) \quad (49).$$

For the wideband predistorter $$Y(\varepsilon) = \alpha A_2 \quad (50),$$

and is also known that $$K_{PD}(A_1,A_1) = F_{CW}^{-1}(A_1) \quad (51),$$

because this simply corresponds to a static predistorter. Substituting equations (50) and (51) into equation (49) results in a two dimensional wideband predistortion kernel $K_{PD}(.)$ as follows:

$$K(K_{PD}(A_2,A_1),|F_{CW}^{-1}(\alpha A_1)|) - \alpha A_2 = 0 \quad (52).$$

Solving equation (52) for a complete range of amplitude values $A_1$ and $A_2$ results in the complete knowledge of the two dimensional wideband predistortion kernel $K_{PD}(.)$. Of note, only the knowledge of the two dimensional kernel K(.) is required to perform the calculations as $$F_{CW}(A_1) = K(A_1,A_1) \quad (53).$$

The method for predistorting signals using the dynamic X-parameter model with kernels $F_P(.)$ and $G_P(.)$ as in the representative embodiments has been experimentally validated as hereinafter described. The dynamic predistorter technique was applied on a packaged amplifier, in particular a Mini-Circuits ZFL-11AD+. A dynamic X-parameter model was extracted for this amplifier at a carrier frequency of 1750 MHz, and the corresponding dynamic X-parameter model was experimentally validated using different kinds of signals such as large signal steps, two-tone signals, and complex modulated signals (cdma2000, WCDMA). The kernels of the corresponding dynamic predistorter were subsequently calculated in the manner previously described. The predistorter was then implemented in ADS 2009, a commercial harmonic balance simulator. To test the performance of the dynamic predistorter, several simulations were performed using the dynamic predistorter cascaded with a dynamic X-parameter model of the amplifier. The results of two such simulations are shown in FIGS. 5 and 6.

Figure 5:
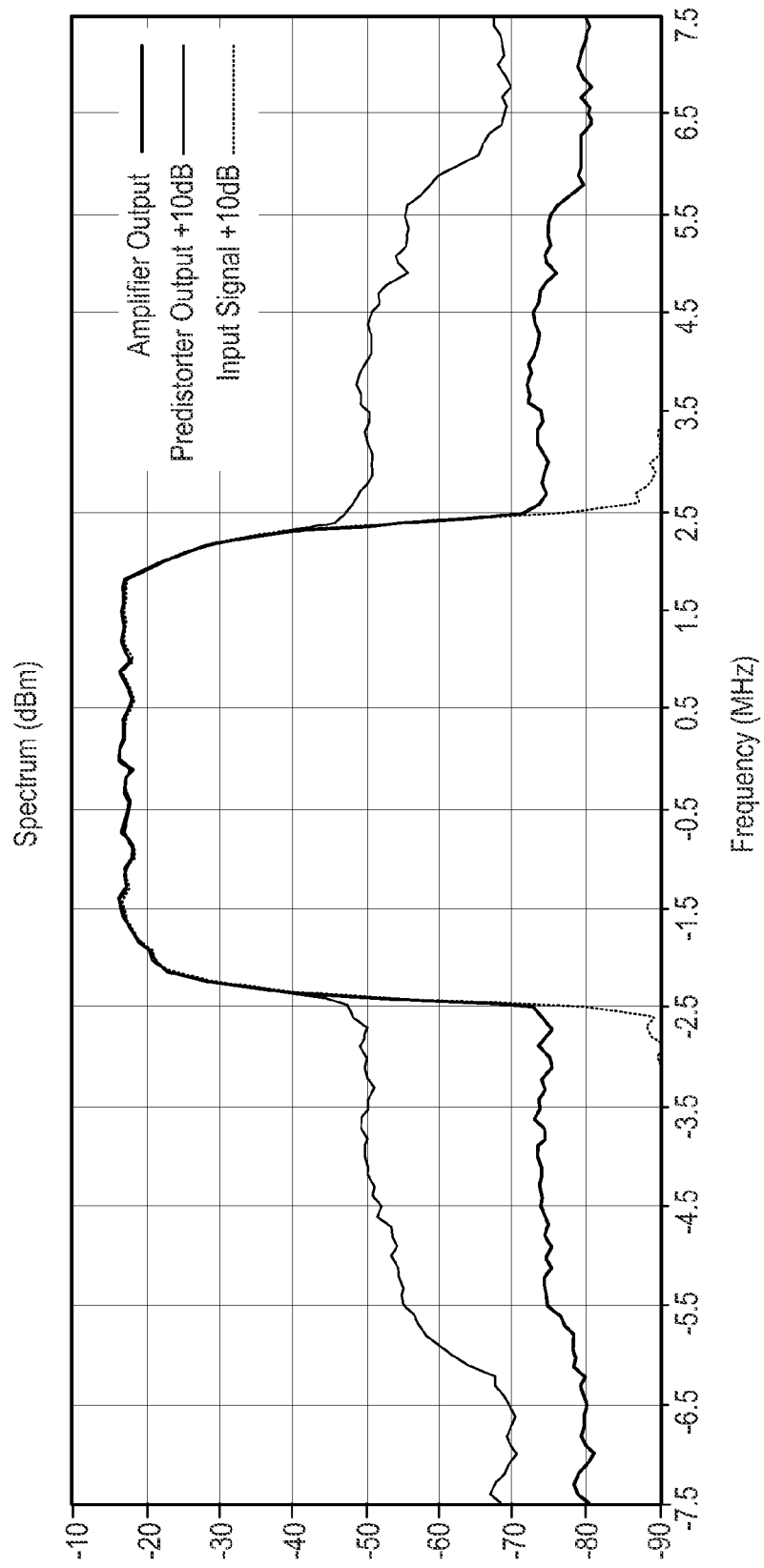
FIG. 5 is a graph illustrating the results of a simulation, according to a representative embodiment.
Figure 6:
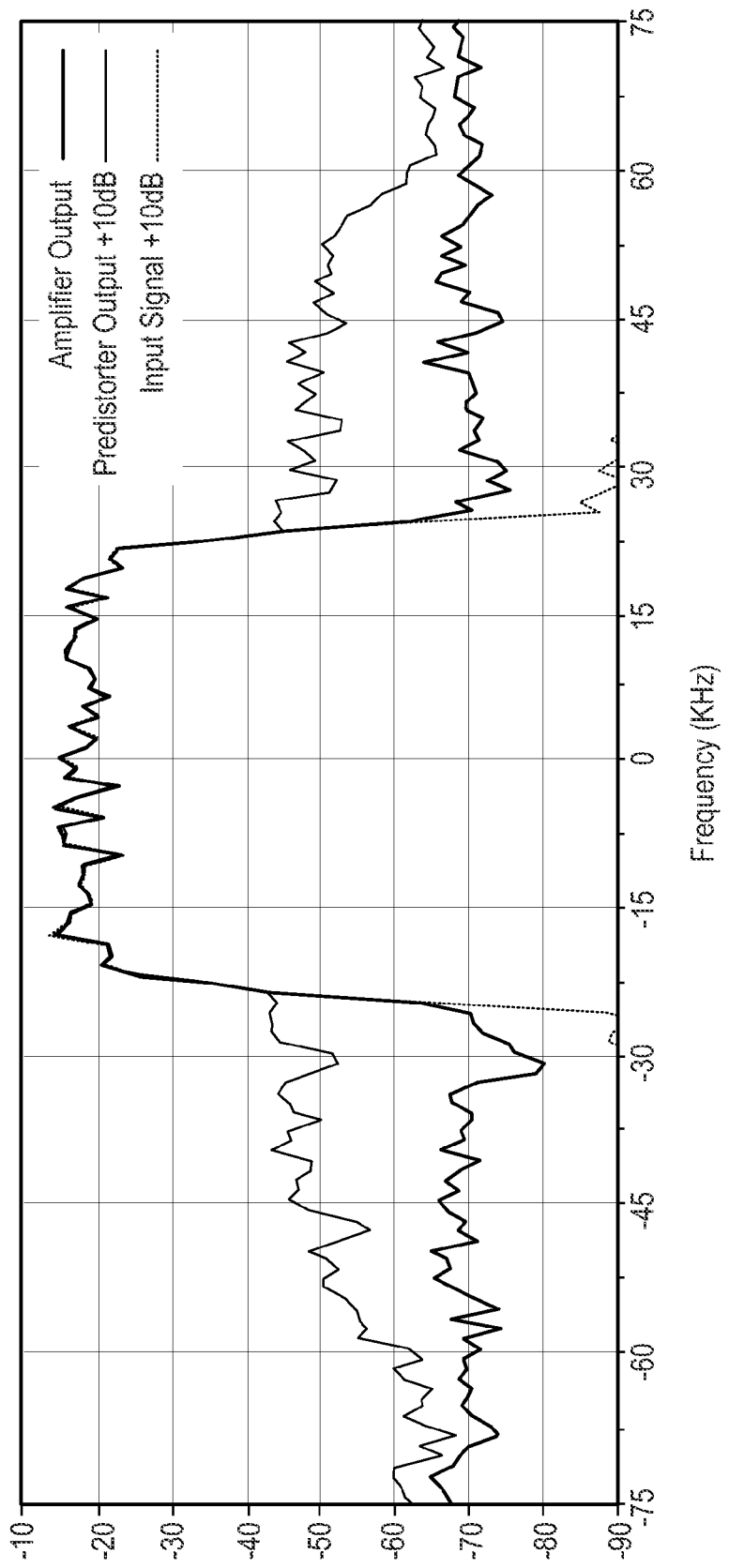
FIG. 6 is a graph illustrating the results of another simulation, according to a representative embodiment.

The results of a first simulation wherein a signal with WCDMA-like characteristics (5 MHz modulation bandwidth and similar amplitude distribution) was applied to the dynamic predistorter cascaded with a dynamic X-parameter model of the amplifier is shown in FIG. 5. The results of a second simulation wherein a signal with the same amplitude distribution as in FIG. 5 but with a largely reduced modulation bandwidth (only 60 kHz modulation bandwidth) was applied to the dynamic predistorter cascaded with a dynamic X-parameter model of the amplifier is shown in FIG. 6. In FIGS. 5 and 6, traces representing the input signal+10 dB, the predistorter output+10 dB, and the amplifier output are depicted. These results show that the predistorter substantially eliminates spectral regrowth, as would be expected. Significantly, the predistorter was completely calculated based upon large signal step measurements, which are signals very different than the signals applied to the dynamic predistorter cascaded with a dynamic X-parameter model of the amplifier during the experimental validation. This proves the robustness of the approach.

Figure 7:
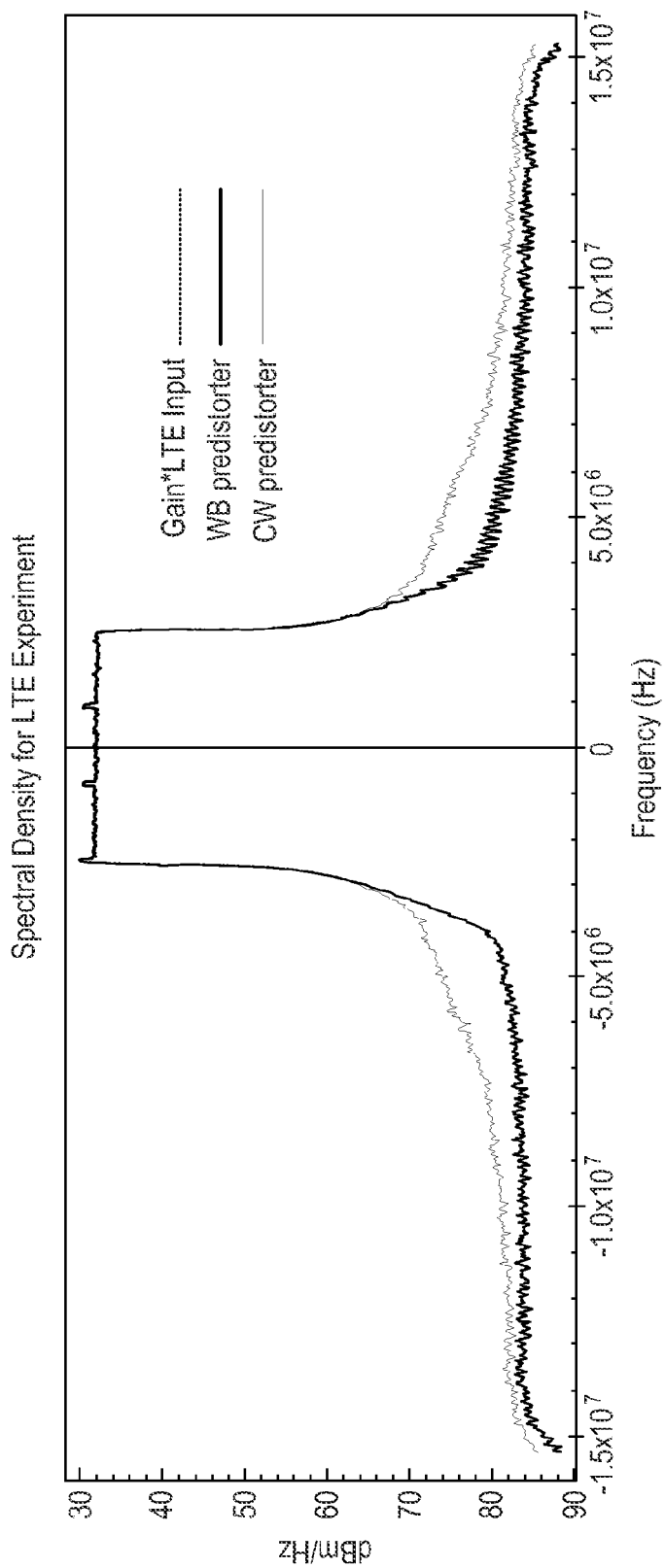
FIG. 7 is a graph illustrating the results of a further simulation for wideband modulation, according to a representative embodiment.

An experimental validation of a simplified predistorter designed for wideband modulation of the further representative embodiments was performed on a 25 W GaN MMIC amplifier from CREE. A wideband X-parameter model at a carrier frequency of 2 GHz was first experimentally extracted for this component using pulsed measurements. This wideband X-parameter model was validated using LTE and WCDMA input signals. The extracted wideband X-parameter kernel was then used to calculate the kernel for the wideband predistorter. To test the performance of the wideband predistorter, several simulations were performed of the wideband predistorter cascaded with the wideband X-parameter model of the amplifier. The results of this further simulation are shown in FIG. 7. In FIG. 7, traces representing the LTE input signal as amplified with gain α, the simulated amplifier output using the wideband (WB) predistorter of the representative embodiments, and the simulated amplifier output using the continuous (CW) predistorter of the representative embodiments are depicted. As shown in FIG. 7, the traces representing the LTE input signal as amplified with gain α and the simulated amplifier output using the wideband predistorter are substantially identical, illustrating the robustness of the simplified wideband approach.

Figure 8:
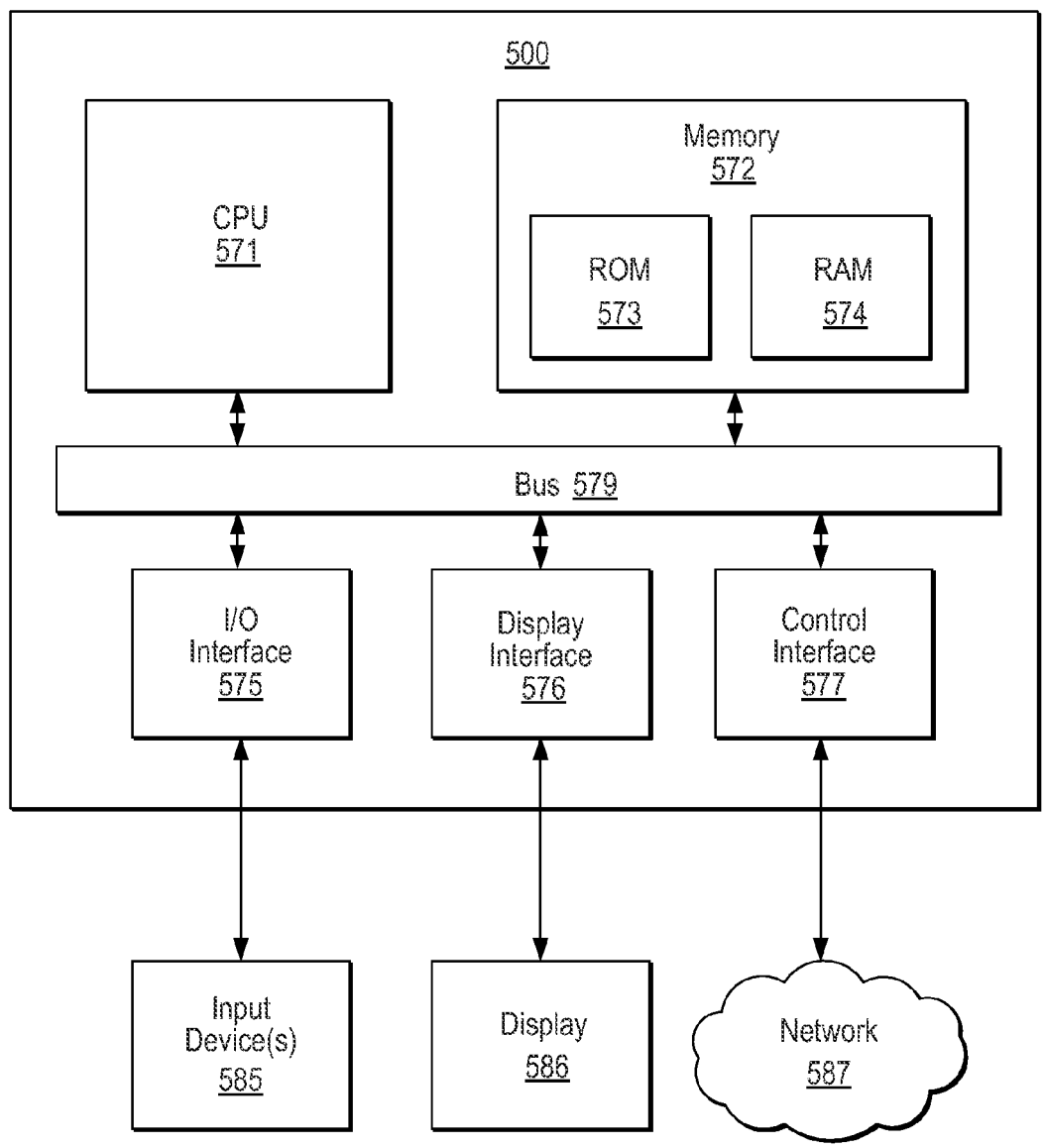
FIG. 8 is a functional block diagram illustrating a computer system 500, for executing an algorithm to control operations of system 10 shown in FIG. 1, according to a representative embodiment.

FIG. 8 is a functional block diagram illustrating a computer system 500, for executing an algorithm to control operations of system 10 of FIG. 1, according to a representative embodiment. The computer system 500 may be any type of computer processing device, such as a PC, capable of executing the various steps of the programming language translation process. In various embodiments, the computer system 500 may be included in a signal generator 200 or a processing device 300, and/or a separate controller or other processing device (not shown), or may be distributed among one or more of these devices.

In the depicted representative embodiment, the computer system 500 includes central processing unit (CPU) 571, memory 572, bus 579 and interfaces 575-577. Memory 572 includes at least nonvolatile read only memory (ROM) 573 and volatile random access memory (RAM) 574, although it is understood that memory 572 may be implemented as any number, type and combination of ROM and RAM and of internal and external memory. Memory 572 may provide look-up tables and/or other relational functionality. In various embodiments, the memory 572 may include any number, type and combination of tangible computer readable storage media, such as a disk drive, compact disc (e.g., CD-R/CD/RW), electrically programmable read-only memory (EPROM), electrically erasable and programmable read only memory (EEPROM), digital video disc (DVD), universal serial bus (USB) drive, diskette, floppy disk, and the like. Further, the memory 572 may store program instructions and results of calculations performed by CPU 571.

The CPU 571 is configured to execute one or more software algorithms, including control of system 10 according to various embodiments described herein, e.g., in conjunction with memory 572. The CPU 571 may include its own memory (e.g., nonvolatile memory) for storing executable software code that allows it to perform the various functions. Alternatively, the executable code may be stored in designated memory locations within memory 572. The CPU 571 may execute an operating system, such as Windows® operating systems available from Microsoft Corporation or Unix operating systems (e.g., Solaris™ available from Sun Microsystems, Inc.), and the like.

In an embodiment, a user and/or other computers may interact with the computer system 500 using input device(s) 585 through I/O interface 575. The input device(s) 585 may include any type of input device, for example, a keyboard, a track ball, a mouse, a touch pad or touch-sensitive display, and the like. Also, information may be displayed by the computer system 500 on display 586 through display interface 576, which may include any type of graphical user interface (GUI), for example.

The computer system 500 may also include a control interface 577 for communicating with various components of system 10. For example, in various embodiments, the computer system 500 is able to communicate with the microwave component 100 to receive the set of RF large signal step responses, the signal generator 200 to define the test signal for the microwave component 100 and/or the processing device 300 to provide the input signal, as discussed above, via a wired or wireless LAN, for example, indicated by network 587. The control interface 577 may include, for example, a transceiver (not shown), including a receiver and a transmitter, that communicates wirelessly over a data network through an antenna system (not shown), according to appropriate standard protocols. However, it is understood that the control interface 577 may include any type of interface, without departing from the scope of the present teachings.

The various "parts" shown in system 10 may be physically implemented using a software-controlled microprocessor, hard-wired logic circuits, or a combination thereof. In an embodiment, computer system 500 may carry out the functionality of signal generator 200 and/or processing device 300. In a further embodiment, computer system 500 may also model or provide a virtual representation of microwave component 100 and the dynamic predistorter, in addition to carrying out the functionality of signal generator 200 and/or processing device 300. In this further embodiment, computer system 500 may also generate or otherwise provide the set of RF large signal steps, which themselves may be simulated, to the virtual representative of microwave component 100, whereby the virtual representative of microwave component 100 may subsequently provide the RF large signal step response for calculation of the dynamic X-parameter kernels of the predistorter. Computer system 500 may thus be configured to carry out all or part of the functionality of system 10 using program instructions which may be stored as code segment in any number, type and combination of the above noted tangible computer readable storage media or non-transitory computer readable medium. System 10 may thus be virtually implemented.

The various "parts" shown in the computer system 500 may be physically implemented using a software-controlled microprocessor, hard-wired logic circuits, or a combination thereof. Also, while the parts are functionally segregated in the computer system 500 for explanation purposes, they may be combined variously in any physical implementation.

As would be apparent to one of ordinary skill, system 10 predistorts an input signal, and responsive thereto the system outputs a substantially non-distorted version of the input signal. System 10 can also be used to predistort other various frequency phenomena, such as for example non-linear optical phenomena, and non-linear mechanical phenomena including sound, vibration, shock wave and distortions. In view of this disclosure, those skilled in the art can implement these applications while remaining within the scope of the appended claims.

As would be further apparent to one of ordinary skill, various representative embodiments provide a method of predistorting signals for microwave component 100. In representative embodiments microwave component 100 may be an amplifier. However, this is merely illustrative and the use of other microwave components and systems are contemplated. The microwave component may comprise other components such as transistors, diodes, monolithic microwave integrated circuits (MMICS), multichip modules (MCMs), non-linear electronic analog components or circuits, and non-linear RF systems, without departing from the scope of the present teachings. The input signals provided for predistortion may include arbitrarily modulated signals, such as simple two-tone excitations, pulsed excitations and more complex modulated RF excitations, or standard wideband digitally modulated formats for communication signals such as wideband code division multiple access (WCDMA), long term evolution (LTE) and worldwide interoperability for microwave access (WiMAX), for example.

The various components, materials, structures and parameters are included by way of illustration and example only and not in any limiting sense. In view of this disclosure, those skilled in the art can implement the present teachings in determining their own applications and needed components, materials, structures and equipment to implement these applications, while remaining within the scope of the appended claims.

Therefore the invention should not be limited to the particular example embodiments described in detail above.

While example embodiments are disclosed herein, one of ordinary skill in the art appreciates that many variations that are in accordance with the present teachings are possible and remain within the scope of the appended claims. The invention therefore is not to be restricted except within the scope of the appended claims.

The invention claimed is:

1. A non-transitory computer readable medium that stores a program executable by a computer for predistorting signals, the computer readable medium comprising:
   a generating code segment for generating a test signal;
   a system model code segment for generating a system model of a system from an output signal of the system generated in response to the test signal, the system model including a dynamic part that characterizes memory effects of the system;

a memory model code segment for generating an inverse memory model from the system model; and a predistorting code segment for predistorting an input signal using the inverse memory model, wherein the inverse memory model is insensitive to changes in modulation bandwidth of the input signal.

2. A computer readable medium according to claim 1, further comprising:

an applying code segment for applying the predistorted signal to the system to produce a signal that is a substantially non-distorted version of the input signal.

3. A computer readable medium according to claim 2, wherein the system comprises an amplifier that produces an amplified signal that is a substantially non-distorted version of the input signal.

4. A computer readable medium according to claim 1, wherein the inverse memory model is also insensitive to changes in amplitude distribution of the input signal.

5. A computer readable medium according to claim 1, wherein the test signal comprises a set of large signal steps.

6. A computer readable medium according to claim 5, wherein the output signal comprises large signal step responses.

7. A computer readable medium according to claim 5, wherein the set of large signal steps switch at an initial time from a first value to a second value, and cover a range of possible input signal amplitude values.

8. A computer readable medium according to claim 1, wherein the dynamic part of the system model changes responsive to varying operational conditions of the system including at least one of temperature, bias voltage and trapping states.

9. A method, comprising:

generating a test signal;

generating a system model of a system from an output signal of the system generated in response to the test signal, the system model including a dynamic part that characterizes memory effects of the system;

generating an inverse memory model from the system model; and predistorting an input signal using the inverse memory model, wherein the inverse memory model is insensitive to changes in modulation bandwidth of the input signal.

10. A method as claimed in claim 9, further comprising:

applying the predistorted signal to the system to produce a signal that is a substantially non-distorted version of the input signal.

11. A method as claimed in claim 10, wherein the system comprises an amplifier that produces an amplified signal that is a substantially non-distorted version of the input signal.

12. A method as claimed in claim 9, wherein the inverse memory model is also insensitive to changes in amplitude distribution of the input signal.

13. A method as claimed in claim 9, wherein the test signal comprises a set of large signal steps.

14. A method as claimed in claim 13, wherein the output signal comprises large signal step responses.

15. A method as claimed in claim 13, wherein the set of large signal steps switch at an initial time from a first value to a second value, and cover a range of possible input signal amplitude values.

16. A method as claimed in claim 9, wherein said generating a system model and said generating an inverse memory model are software implemented.

17. A method as claimed in claim 9, wherein said generating a system model and said generating an inverse memory model are hardware implemented.

18. A method as claimed in claim 9, wherein the dynamic part of the system model changes responsive to varying operational conditions of the system including at least one of temperature, bias voltage and trapping states.

19. A predistorting system comprising:

an input device for receiving an input signal;

a processing device configured to generate a system model of a system from an output signal of the system generated in response to a test signal and to generate an inverse memory model from the system model, wherein the system model includes a dynamic part that characterizes the memory effects of the system; and a predistorter configured to predistort the input signal using the inverse memory model, wherein the inverse memory model is insensitive to changes in modulation bandwidth of the input signal.

20. The predistorting system according to claim 19, wherein the system outputs a substantially non-distorted version of the input signal responsive to the predistorted signal.

21. The predistorting system according to claim 20, wherein the system comprises an amplifier that produces an amplified signal that is a substantially non-distorted version of the input signal.

22. The predistorting system according to claim 19, wherein the inverse memory model is also insensitive to changes in amplitude distribution of the input signal.

23. The predistorting system according to claim 19, wherein the test signal comprises a set of large signal steps provided by a signal generator.

24. The predistorting system according to claim 23, wherein the system model includes inverse large signal step responses, and the processing device generates the inverse memory model from the inverse large signal step responses.

25. The predistorting system according to claim 23, wherein the set of large signal steps switch at an initial time from a first value to a second value, and cover a range of possible input signal amplitude values.

26. The predistorting system according to claim 19, wherein the dynamic part of the system model changes responsive to varying operational conditions of the system including at least one of temperature, bias voltage and trapping states.

* * * * *

UNITED STATES PATENT AND TRADEMARK OFFICE
CERTIFICATE OF CORRECTION

PATENT NO. : 8,914,271 B2
APPLICATION NO. : 13/307311
DATED : December 16, 2014
INVENTOR(S) : Jan Verspecht Page 1 of 1

It is certified that error appears in the above-identified patent and that said Letters Patent is hereby corrected as shown below:

On the Title page, in item (57), in column 2, in "Abstract", lines 7-8, delete "component model." and insert -- component. --, therefor.

In the Claims

In column 19, line 9, in claim 2, after "A" insert -- non-transitory --.

In column 19, line 14, in claim 3, after "A" insert -- non-transitory --.

In column 19, line 18, in claim 4, after "A" insert -- non-transitory --.

In column 19, line 21, in claim 5, after "A" insert -- non-transitory --.

In column 19, line 23, in claim 6, after "A" insert -- non-transitory --.

In column 19, line 26, in claim 7, after "A" insert -- non-transitory --.

In column 19, line 30, in claim 8, after "A" insert -- non-transitory --.

Signed and Sealed this
Twenty-eighth Day of April, 2015

Michelle K. Lee
*Director of the United States Patent and Trademark Office*